(12) United States Patent
Huang et al.

(10) Patent No.: US 7,511,366 B2
(45) Date of Patent: Mar. 31, 2009

(54) MULTI-ROW SUBSTRATE STRIP AND METHOD FOR MANUFACTURING THE SAME

(75) Inventors: Yao-Ting Huang, Koashiung (TW); Kuang-Lin Lo, Kaoshiung (TW)

(73) Assignee: Ase (Shanghai) Inc., Shanghai (CN)

( * ) Notice: Subject to any disclaimer, the term of this patent is extended or adjusted under 35 U.S.C. 154(b) by 294 days.

(21) Appl. No.: 11/258,085

(22) Filed: Oct. 26, 2005

(65) Prior Publication Data

US 2006/0091533 A1   May 4, 2006

(30) Foreign Application Priority Data

Oct. 28, 2004   (TW) .............................. 93132780 A

(51) Int. Cl.
*H01L 23/02* (2006.01)

(52) U.S. Cl. .................................................. 257/678

(58) Field of Classification Search ................. 438/127; 257/697, 678; 174/522
See application file for complete search history.

(56) References Cited

U.S. PATENT DOCUMENTS

| | | | | | |
|---|---|---|---|---|---|
| 5,981,873 | A | * | 11/1999 | Heo | 174/522 |
| 6,057,179 | A | * | 5/2000 | Lin et al. | 438/127 |
| 6,114,760 | A | * | 9/2000 | Kim et al. | 257/697 |
| 6,580,620 | B1 | | 6/2003 | Kim | |

* cited by examiner

*Primary Examiner*—Davienne Monbleau
*Assistant Examiner*—Monica D Harrison
(74) *Attorney, Agent, or Firm*—Volentine & Whitt, P.L.L.C.

(57) ABSTRACT

A multi-row substrate strip mainly includes a plurality of first and second substrate units in parallel, a plurality of connecting bars, a degating metal layer and at least one plating layer. The connecting bars are used to connect the first substrate units and connect the second substrate units. The degating metal layer includes a plurality of runner portions on the connecting bars, a plurality of first gate portions and a plurality of second gate portions. The first gate portions are formed on the first substrate units, and the second gate portions are formed on the second substrate units. The plating layer is formed on the first gate portions and the second gate portions, and exposes the runner portions, so as to save the plating material.

20 Claims, 5 Drawing Sheets

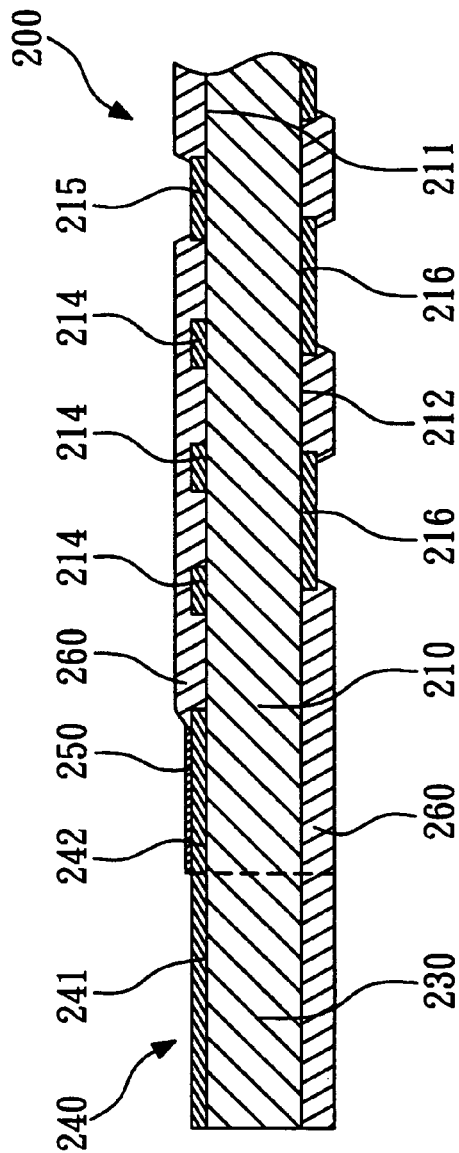
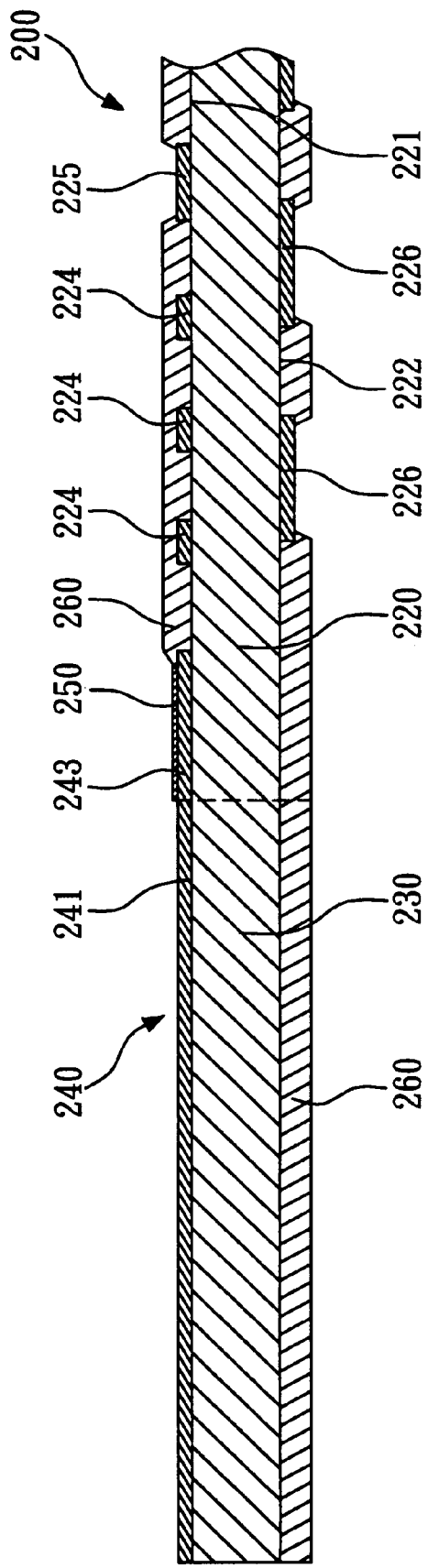
FIG. 4
FIG. 5

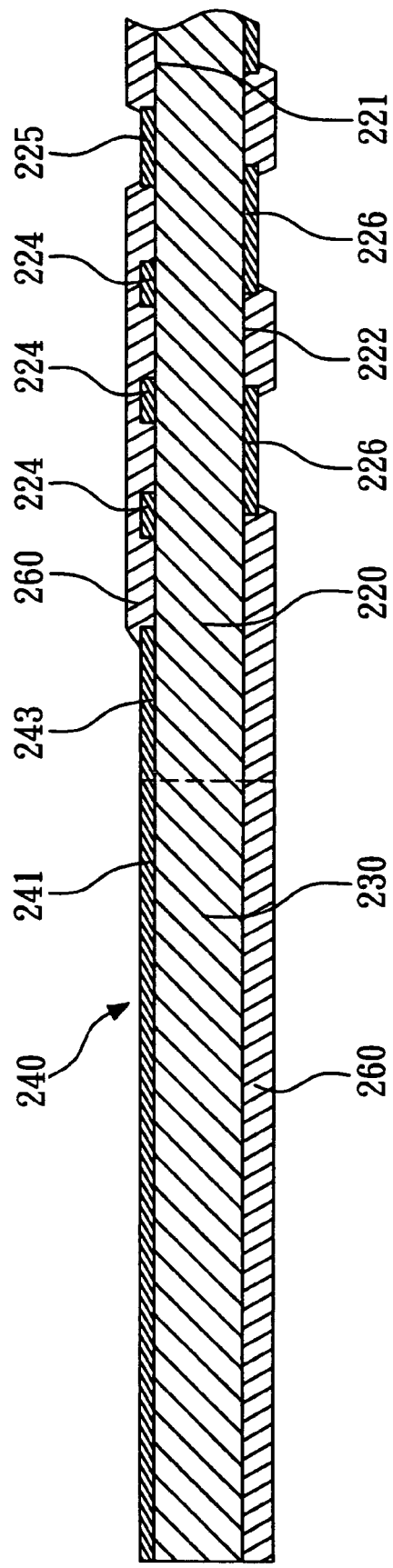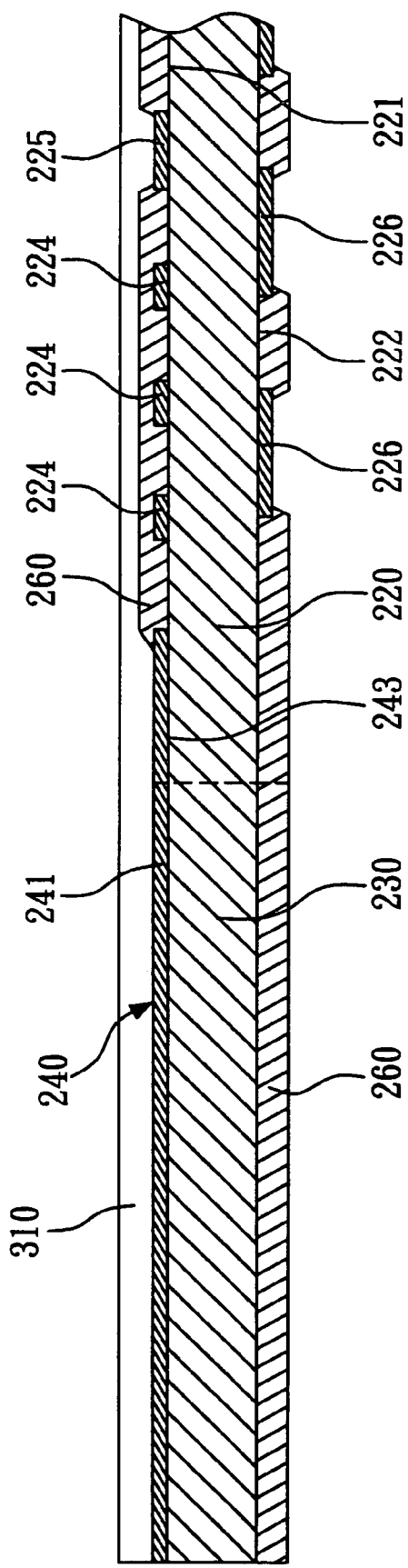
FIG. 6A
FIG. 6B

MULTI-ROW SUBSTRATE STRIP AND METHOD FOR MANUFACTURING THE SAME

BACKGROUND OF THE INVENTION

1. Field of the Invention

The invention relates to a substrate strip used for chip package, and particularly, to a multi-row substrate strip and a method for manufacturing the same.

2. Description of the Related Art

The conventional substrate strip comprises a plurality of substrate units. In the semi-conductor package technology, a plurality of chips are disposed on these substrate units, and undergo the steps of appropriate wire bonding process for electrical connection, and molding process to seal the chips with a molding compound; and finally these substrate units are cut and separated to form a plurality of semi-conductor package structures.

With reference to FIGS. 1 and 2, a conventional substrate strip 100 comprises a plurality of substrate units 110 in a single row each having a surface 111, and a plurality of connecting bars 120 between adjacent substrate units 110, wherein at lease one corner 112 of each of the substrate units 110 is connected to the connecting bars 120. A metal layer 130 is formed on the surfaces 111 of the substrate strip 100; a solder mask 140 is formed on the substrate strip 100 to expose the metal layer 130; a plating layer 150 may be formed on the metal layer 130 by means of plating or others. The metal layer 130 comprises a plurality of runner portions 131 and a plurality of gate portions 132, wherein the runner portions 131 are formed on the connecting bars 120, and the gate portions 132 are formed at the corners 112 of the substrate units 110. The plating layer 150 allows the remainder material of a molding compound (not shown) to be de-gated easily after the molding process, without damaging a plurality of traces 113 of the substrate units 110 or the molding compound of the sealed chip.

After the processes of die mounting and electrically connecting are completed, during the molding process, the molding compound can be injected into a cavity (not shown) of a molding tool along the runner portions 131 and the gate portions 132 of the metal layer 130, so as to seal the chip. Subsequently, the degating operation is proceeded to de-gate the remainder material of the molding compound on the runner portions 131 and the gate portions 132. Then the substrate strip 100 is cut and separated into a plurality of package structures along the plurality of slots 101, while the connecting bars 120 and other remainder frames are discarded.

In order to increase the number of the substrate units, a plurality of substrate units of a conventional substrate strip are designed to be arranged in double (multiple) rows. For example, U.S. Pat. No. 6,580,620 discloses a printed circuit board with a matrix configuration comprising a plurality of printed circuit board units arranged in matrix, i.e., in double (multiple) rows. The corner of each of the printed circuit board units is connected with a first mold runner gate or a second mold runner gate. The first mold runner gates and the corresponding second mold runner gates are connected by a plurality of integrated mold runners, which are located between the printed circuit board units in the first row. A plating process is conducted to apply a plating material to the first mold runner gates and the second mold runner gates and the integrated mold runners. However, after the package process has been finished and individual packages have been cut and separated, the plating material on the integrated mold runners will be discarded together with the remainder frames, leading to a waste of plating material.

Consequently, there is an existing need for a multi-row substrate strip and a method for manufacturing the same to solve the above-mentioned problems.

SUMMARY OF THE INVENTION

The object of the present invention is to provide a multi-row substrate strip, comprising a plurality of substrate units in multiple rows, a plurality of connecting bars, a degating metal layer and at least one plating layer. The connecting bars are used to connect the substrate units. The degating metal layer comprises a plurality of runner portions on the connecting bars, a plurality of first gate portions and a plurality of second gate portions. The plating layer is only formed on the first gate portions and the second gate portions of the degating metal layer and exposes the runner portions, and therefore the waste of the plating material can be avoided.

Another object of the present invention is to provide a method for manufacturing the multi-row substrate strip. First, a multi-row substrate strip is provided, which comprises a degating metal layer including a plurality of runner portions, a plurality of first gate portions and a plurality of second gate portions. And a mask component is formed on the multi-row substrate strip, wherein the mask component covers the runner portions and exposes the first gate portions and the second gate portions, so that at least one plating layer is formed on the first gate portions and the second gate portions for reducing the area of the plating layer. Therefore, the waste of the plating material can be avoided and the cost can be saved.

In the present invention, the multi-row substrate strip comprises a plurality of first substrate units and second substrate units in parallel, a plurality of connecting bars, a degating metal layer and at least one plating layer. The connecting bars are used to connect the first substrate units and to connect the second substrate units. The degating metal layer comprises a plurality of runner portions on the connecting bars, a plurality of first gate portions and a plurality of second gate portions. The first gate portions are formed on the first substrate units, and the second gate portions are formed on the second substrate units. The plating layer is formed on the first gate portions and the second gate portions, and exposes the runner portions.

BRIEF DESCRIPTION OF THE DRAWINGS

FIG. 4 is a cross-sectional schematic view of the multi-row substrate strip along the runner portions and the first gate portions, in accordance with an embodiment of the invention;

FIG. 5 is a cross-sectional schematic view of the multi-row substrate strip along the runner portions and the second gate portions, in accordance with an embodiment of the invention; and FIGS. 6A-6D are cross-sectional views of the multi-row substrate strip during its manufacture along the runner portions and the second gate portions, in accordance with an embodiment of the invention.

DETAILED DESCRIPTION OF THE INVENTION

The invention will be illustrated by the following embodiments, with reference to all accompanying drawings.

Figure 1:
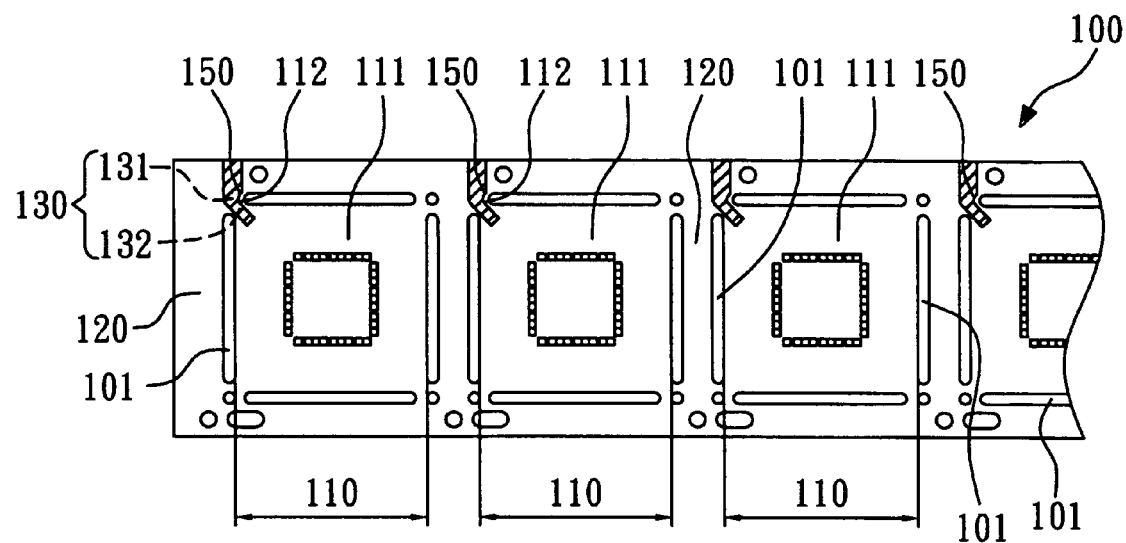
FIG. 1 is a front schematic view of the conventional single-row substrate strip.
Figure 2:
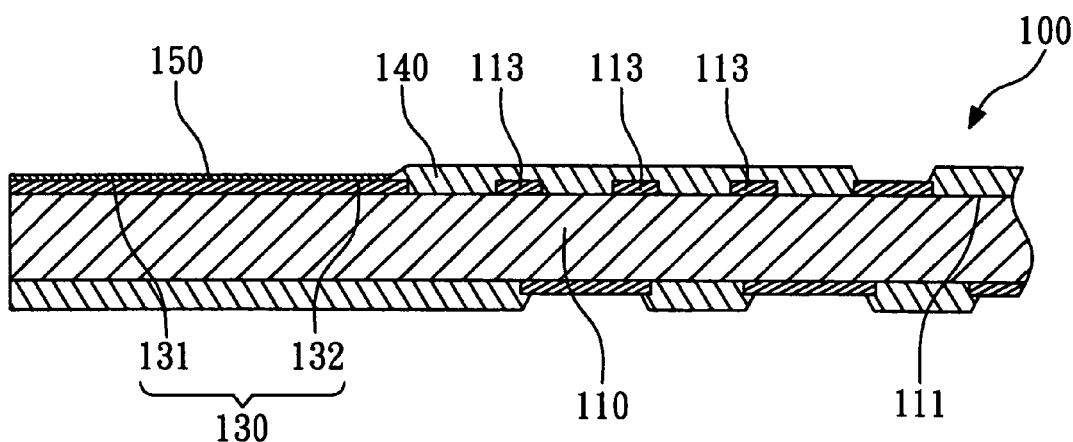
FIG. 2 is a cross-sectional schematic view of the conventional single-row substrate strip along the runner portions and the gate portions.
Figure 3:
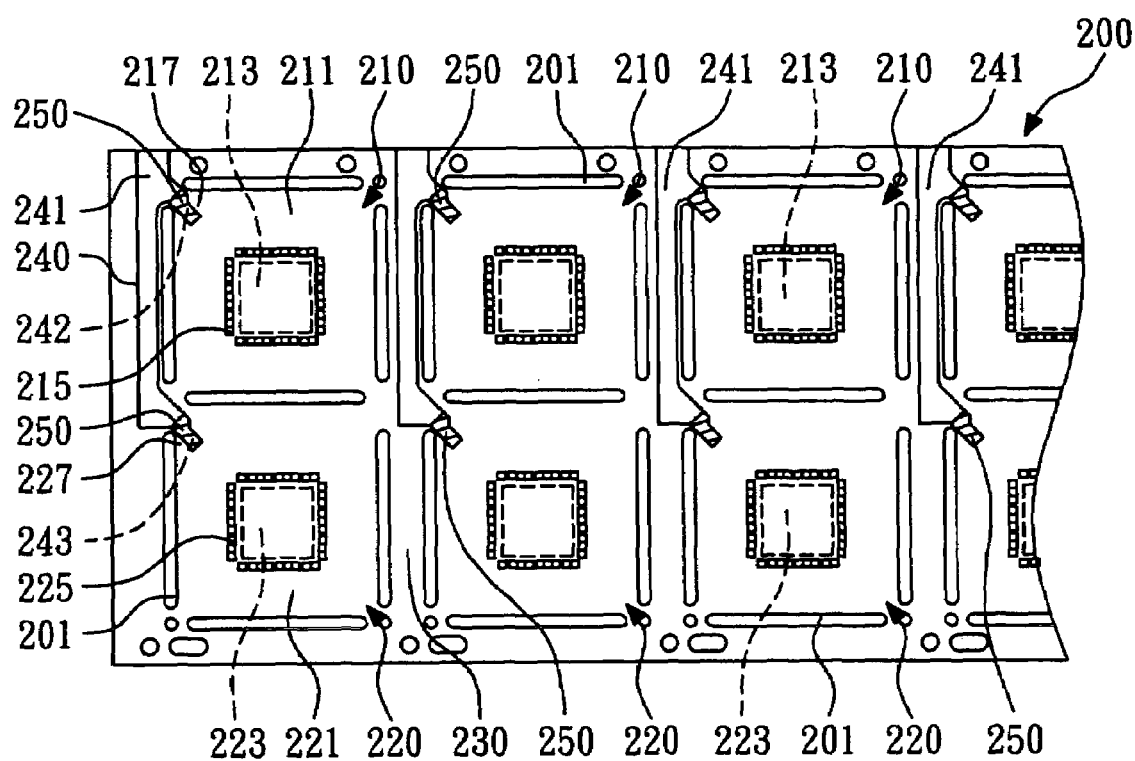
FIG. 3 is a front schematic view of the multi-row substrate strip in accordance with an embodiment of the invention.

With reference to FIG. 3, a multi-row substrate strip 200 comprises a plurality of substrate units arranged in matrix, according to an embodiment of the invention. In the embodiment, the multi-row substrate strip 200 comprises a plurality of first substrate units 210, a plurality of second substrate units 220, a plurality of connecting bars 230, a degating metal layer 240 and a plurality of plating layers 250. In the embodiment, the first substrate units 210 and the second substrate units 220 are in parallel.

With reference to FIGS. 3 and 4, each of the first substrate units 210 has an upper surface 211 and a lower surface 212. A chip mounting area 213 is defined on each of the upper surfaces 211 and may be disposed on the central regions thereof. A plurality of traces 214 and a plurality of internal connecting pads 215 are formed on the upper surfaces 211, wherein the internal connecting pads 215 may surround the corresponding chip mounting areas 213. As shown in FIG. 4, the first substrate units 210 may comprise a plurality of ball pads 216 on the lower surfaces 212 for disposing a plurality of solder balls (not shown).

With reference to FIGS. 3 and 5, the second substrate units 220 have an upper surface 221 and a lower surface 222. A chip mounting area 223 is defined on each of the upper surfaces 221 and may be disposed on the central regions thereof. A plurality of traces 224 and a plurality of internal connecting pads 225 are formed on the upper surfaces 221, wherein the internal connecting pads 225 may surround the corresponding chip mounting areas 223. As shown in FIG. 5, the second substrate units 220 may comprise a plurality of ball pads 226 on the lower surfaces 222 for disposing a plurality of solder balls (not shown).

The connecting bars 230 are formed between the first substrate units 210 and between the second substrate units 220, for connecting the first substrate units 210 and for connecting the second substrate units 220. In the embodiment, at least one corner 217 of each of the first substrate units 210 is connected to the connecting bars 230, and at least one corner 227 of each of the second substrate units 220 is connected to the connecting bars 230. The substrate strip 200 comprises a plurality of slots 201, which are formed on the peripheral edges of the first substrate units 210 and the second substrate units 220. After the package process is completed, a plurality of packages comprising the first substrate units 210 or the second substrate units 220 can be separated from the substrate strip 200 along the slots 201 by singulation.

With reference to FIGS. 3, 4 and 5, the degating metal layer 240 comprises a plurality of runner portions 241 on the connecting bars 230, a plurality of first gate portions 242 and a plurality of second gate portions 243. In the embodiment, the first gate portions 242 are formed at the corners 217 of the first substrate units 210, and the second gate portions 243 are formed at the corners 227 of the second substrate units 220, i.e., each of the runner portions 241 is connected with the first gate portion 242 and the second gate portion 243. The degating metal layer 240 may contain copper. The traces 214 and the internal connecting pads 215 of the upper surfaces 211 and the traces 224 and the internal connecting pads 225 of the upper surfaces 221 are formed together with the degating metal layer 240 with the same material.

In the embodiment, a solder mask 260 (i.e., commonly known as green painting) is formed on the first substrate units 210 and the second substrate units 220 of the multi-row substrate strip 200 for protecting the traces 214, 224. The solder mask 260 exposes the degating metal layer 240 and the ball pads 216, 226.

The plating layers 250 are formed on the first gate portions 242 and the second gate portions 243 of the degating metal layer 240, and expose the runner portions 241. The plating layers 250 preferably contain a nickel layer and a gold layer.

Figure 6C:
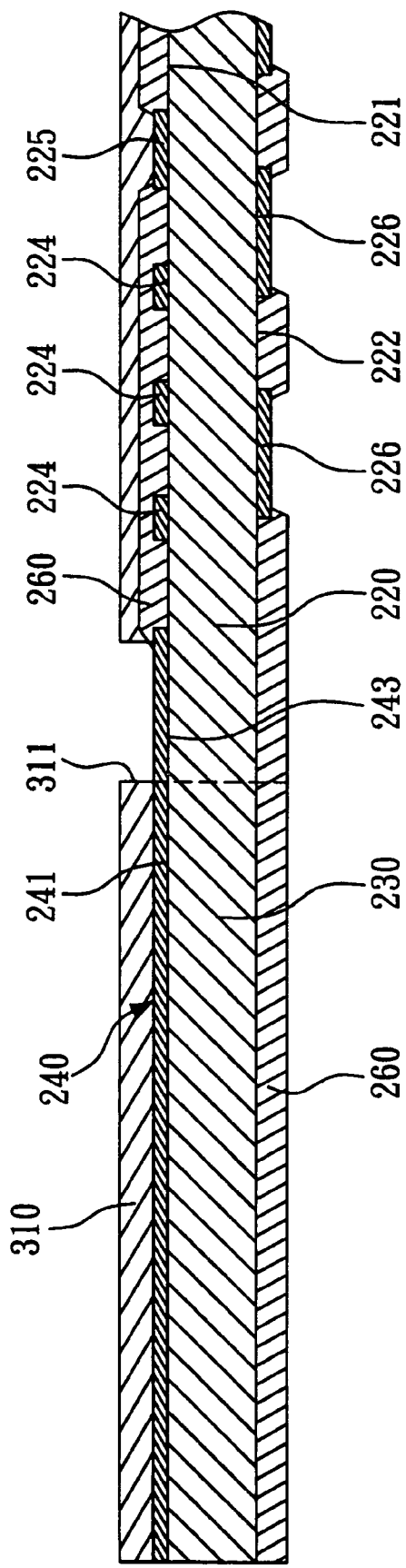

FIGS. 6A to 6D are schematic views of a method for manufacturing a multi-row substrate strip of the invention. With reference to FIGS. 3, 4 and 6A, first a multi-row substrate strip is provided, which comprises a plurality of first substrate units 210, a plurality of second substrate units 220, a plurality of connecting bars 230, a degating metal layer 240 and a solder mask 260. In the embodiment, the first substrate units 210 are arranged in the first row, the second substrate units 220 are arranged in the second row, and the connecting bars 230 are formed between the first substrate units 210 and between the second substrate units 220 for connecting the first substrate units 210 and for connecting the second substrate units 220. The first substrate units 210 have an upper surface 211 and a lower surface 212, and comprise a plurality of ball pads 216 which are formed on the lower surfaces 212. The second substrate units 220 have upper surfaces 221 and lower surfaces 222, and comprise a plurality of ball pads 226 which are formed on the lower surfaces 222. The degating metal layer 240 comprises a plurality of runner portions 241 on the connecting bars 230, a plurality of first gate portions 242 and a plurality of second gate portions 243. In the embodiment, the first gate portions 242 are formed at a plurality of corners 217 of the first substrate units 210, and the second gate portions 243 are formed at a plurality of corners 227 of the second substrate units 220. The solder mask 260 is formed on the first substrate units 210 and the second substrate units 220, and exposes the degating metal 240 and the ball pads 216, 226.

With reference to FIG. 6B, a mask component 310 is formed on the multi-row substrate strip 200. The mask component 310 covers the runner portions 241 of the degating metal layer 240 and the internal connecting pads 215, 225. The mask component 310 can be a dry film, clamping tool or adhesive tape.

With reference to FIG. 6C, in the embodiment, the mask component 310 is a dry film. It is exposed and developed to form a plurality of openings 311 exposing the first gate portions 242 and the second gate portions 243 of the degating metal layer 240.

Figure 6D:
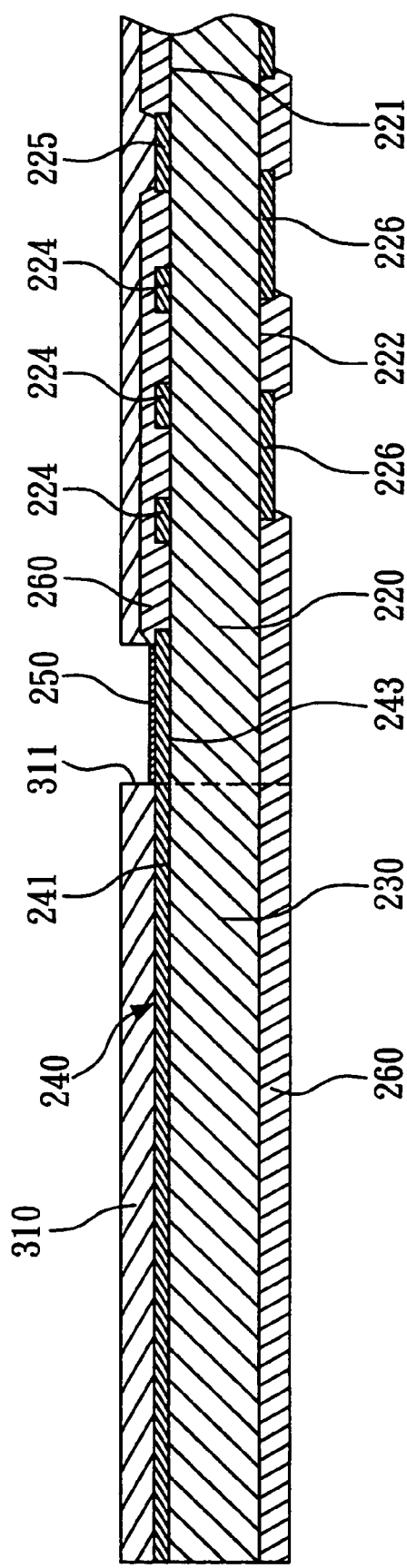

With reference to FIG. 6D, a plurality of plating layers 250 are formed on the first gate portions 242 and the second gate portions 243 of the degating metal layer 240 by means of plating. Referring to FIGS. 3, 4 and 5, after the removal of the mask component 310, the runner portions 241 of the degating metal layer 240 are exposed, i.e., no plating layer 250 are formed on the runner portions 241.

In the multi-row substrate strip 200 and the method for manufacturing the same described above, the plating layer 250 is formed on the first gate portions 242 and the second gate portions 243 of the degating metal layer 240, and exposes the runner portions 241. Therefore, the waste of plating material can be avoided.

While several embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications which maintain the spirit and scope of the present invention are within the scope as defined in the appended claims.

What is claimed is:

1. A multi-row substrate strip, comprising:
a plurality of first substrate units;
a plurality of second substrate units;
a plurality of connecting bars for connecting the first substrate units and for connecting the second substrate units;
a degating metal layer comprising a plurality of runner portions on the connecting bars, a plurality of first gate portions and a plurality of second gate portions, wherein the first gate portions are formed on the first substrate units and the second gate portions are formed on the second substrate units; and
at least one plating layer formed on the first gate portions and the second gate portions, wherein the runner portions are exposed.

2. The multi-row substrate strip according to claim 1, further comprising a solder mask formed on the first substrate units and the second substrate units, wherein the runner portions of the degating metal layer and the plating layer are exposed.

3. The multi-row substrate strip according to claim 1, wherein at least one corner of each of the first substrate units and the second substrate units is connected to the connecting bars.

4. The multi-row substrate strip according to claim 3, wherein the first gate portions are formed at the corners of the first substrate units, and the second gate portions are formed at the corners of the second substrate units.

5. The multi-row substrate strip according to claim 1, further comprising a plurality of slots formed on peripheral edges of the first substrate units and the second substrate units.

6. The multi-row substrate strip according to claim 1, wherein each of the first substrate units and the second substrate units has an upper surface and a lower surface, and the first gate portions and the second gate portions of the degating metal layer are formed on the upper surfaces.

7. The multi-row substrate strip according to claim 6, wherein the first substrate units and the second substrate units comprise a plurality of ball pads formed on the lower surfaces.

8. The multi-row substrate strip according to claim 1, wherein the degating metal layer comprises copper.

9. The multi-row substrate strip according to claim 1, wherein the plating layer comprises gold.

10. The multi-row substrate strip according to claim 9, wherein the plating layer comprises nickel.

11. A method for manufacturing a multi-row substrate strip, comprising:
providing a multi-row substrate strip, wherein the substrate strip comprises a plurality of first substrate units, a plurality of second substrate units, a plurality of connecting bars and a degating metal layer, the connecting bars connect the first substrate units and connect the second substrate units, the degating metal layer comprises a plurality of runner portions on the connecting bars, a plurality of first gate portions and a plurality of second gate portions, wherein the first gate portions are formed on the first substrate units and the second gate portions are formed on the second substrate units;
forming a mask component on the multi-row substrate strip, the mask component covering the runner portions and exposing the first gate portions and the second gate portions;
forming at least one plating layer on the first gate portions and the second gate portions; and
removing the mask component to expose the runner portions.

12. The method for manufacturing a multi-row substrate strip according to claim 11, wherein the plating layer is formed by means of plating.

13. The method for manufacturing a multi-row substrate strip according to claim 11, wherein the mask component is a dry film.

14. The method for manufacturing a multi-row substrate strip according to claim 13, further comprising:
exposing and developing the dry film to form a plurality of openings for exposing the first gate portions and the second gate portions of the degating metal layer.

15. The method for manufacturing a multi-row substrate strip according to claim 11, wherein the multi-row substrate strip comprises a solder mask, which is formed on the first substrate units and the second substrate units and exposes the degating metal layer.

16. The method for manufacturing a multi-row substrate strip according to claim 11, wherein at least one corner of each of the first substrate units and the second substrate units is connected to the connecting bars.

17. The method for manufacturing a multi-row substrate strip according to claim 16, wherein the first gate portions are formed at the corners of the first substrate units, and the second gate portions are formed at the corners of the second substrate units.

18. The method for manufacturing a multi-row substrate strip according to claim 11, wherein a slot is formed between two side edges of the connecting bars and edges of the first substrate units or the second substrate units.

19. The method for manufacturing a multi-row substrate strip according to claim 11, wherein each of the first substrate units and the second substrate units has an upper surface and a lower surface, and the first gate portions and the second gate portions of the degating metal layer are formed on the upper surfaces.

20. The method for manufacturing a multi-row substrate strip according to claim 19, wherein the first substrate units and the second substrate units comprise a plurality of ball pads formed on the lower surfaces.

* * * * *